(12) United States Patent
Lee et al.

(10) Patent No.: US 10,540,915 B2
(45) Date of Patent: Jan. 21, 2020

(54) DISPLAY PANEL SUPPORTING UNIT AND DISPLAY DEVICE USING THE SAME

(71) Applicant: LG DISPLAY CO., LTD., Seoul (KR)

(72) Inventors: Homin Lee, Gangneung-si (KR); Gihyon Jun, Paju-si (KR); Jaehui Yu, Iksan-si (KR); Seoungmo Kang, Paju-si (KR); Dongkwan Yoo, Pyeongtaek-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/394,435

(22) Filed: Dec. 29, 2016

(65) Prior Publication Data

US 2017/0202097 A1   Jul. 13, 2017

(30) Foreign Application Priority Data

Jan. 8, 2016 (KR) .................. 10-2016-0002554

(51) Int. Cl.
| | |
|---|---|
| *G06F 1/16* | (2006.01) |
| *H05K 5/00* | (2006.01) |
| *H05K 7/00* | (2006.01) |
| *G09F 7/18* | (2006.01) |
| *G09F 9/35* | (2006.01) |
| *G09F 9/33* | (2006.01) |

(52) U.S. Cl.
CPC .................. *G09F 7/18* (2013.01); *G06F 1/16* (2013.01); *G09F 9/33* (2013.01); *G09F 9/35* (2013.01); *H05K 5/00* (2013.01); *H05K 7/00* (2013.01)

(58) Field of Classification Search
None
See application file for complete search history.

(56) References Cited

U.S. PATENT DOCUMENTS

| | | | | |
|---|---|---|---|---|
| 8,464,447 | B2* | 6/2013 | Pemberton | G09F 13/08 40/568 |
| 8,971,032 | B2* | 3/2015 | Griffin | G06F 1/1652 345/156 |
| 9,348,450 | B1* | 5/2016 | Kim | G06F 1/1681 |
| 2007/0247800 | A1* | 10/2007 | Smith | B60R 11/0252 361/679.02 |
| 2013/0305497 | A1* | 11/2013 | Coman | B62D 27/06 24/303 |
| 2014/0132896 | A1* | 5/2014 | Choi | G02F 1/13363 349/96 |

(Continued)

FOREIGN PATENT DOCUMENTS

| | | |
|---|---|---|
| KR | 200217382 | 3/2001 |
| KR | 20050006765 A | 1/2005 |
| KR | 200411033 | 3/2006 |

*Primary Examiner* — Courtney L Smith
*Assistant Examiner* — Rashen E Morrison
(74) *Attorney, Agent, or Firm* — Dentons US LLP (57) ABSTRACT

A display panel supporting unit according to an embodiment of the present disclosure includes a first magnet provided on a first support member and a second magnet provided on a second support member and having a residual magnetic flux density that is equal to or greater than a residual magnetic flux density of the first magnet. Accordingly, a display device is provided such that even an edge portion of the display panel can closely contact a wall. A first magnet may be a rubber magnet, and a second magnet may be either a rubber magnet or a rare-earth magnet.

8 Claims, 4 Drawing Sheets

(56) References Cited

U.S. PATENT DOCUMENTS

| | | | |
|---|---|---|---|
| 2016/0065803 A1* | 3/2016 | Williams | H04N 5/645 40/780 |
| 2016/0091748 A1* | 3/2016 | Kuk | G02F 1/133308 349/58 |
| 2016/0198582 A1* | 7/2016 | Yun | H01F 7/0252 361/679.01 |
| 2016/0246328 A1* | 8/2016 | Christie, II | G06F 1/1632 |
| 2016/0348832 A1* | 12/2016 | Yoo | A47B 97/001 |

* cited by examiner

DISPLAY PANEL SUPPORTING UNIT AND DISPLAY DEVICE USING THE SAME

CROSS-REFERENCE TO RELATED APPLICATIONS

This application claims priority from Korean Patent Application No. 10-2016-0002554 filed on Jan. 8, 2016, the disclosure of which is hereby incorporated by reference in its entirety for all purposes as if fully set forth herein.

BACKGROUND

Technical Field

The present disclosure relates to a display device and a method of manufacturing the same, and more particularly, to a display panel supporting unit capable of allowing an edge portion of a display panel to closely contact a wall body, and a display device using the display panel supporting unit.

Description of the Related Art

Examples of recent display devices are plasma display panel (PDP) devices, liquid crystal display (LCD) devices, organic light-emitting diode display (OLED) devices, etc.

These display devices generally have a standing support structure. The standing support structure is a structure in which a support body is arranged on a floor. While such a standing support structure provides high support stability, but may occupy large space.

To address this issue, a wall mount support structure has been recently suggested. The wall mount support structure is a structure in which a support body is arranged on a wall body. Accordingly, the space occupation rate is low. However, in order for such a wall mount support structure to secure support stability of a display device, a complicated structure such as a bracket may be required.

To reduce or prevent such complexity of the wall mount support structure, a lightweight display device and a simple attachment structure are desired.

SUMMARY

Accordingly, the present disclosure is directed to a display device and a method of manufacturing the same that substantially obviate one or more problems due to limitations and disadvantages of the related art.

It is an advantage of the present disclosure to provide a display panel supporting unit, which may not require a separate processing on a wall body or a fixing plate, is capable of allowing an edge portion of a display panel to closely contact the wall body, and is simply detachable, compared to a related art.

It is another advantage of the present disclosure to provide a display device using a display panel supporting unit.

Objects and advantages of the present disclosure are not limited to the above-described advantages and objects, and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, there is provided a display panel supporting unit which supports a rear surface of the display panel, which includes a support member, a first magnet provided in a first area on the rear surface of the support member, and a second magnet provided in a second area outside the first area on the rear surface of the support member, in which a residual magnetic flux density of the second magnet is equal to or greater than a residual magnetic flux density of the first magnet.

The display panel may be easily attached to the magnetic sheet fixed to the wall body by the magnet coupling via the first magnet and the second magnet provided on the rear surface of the support member. In addition, since the residual magnetic flux density of the second magnet in the outer area is higher than the residual magnetic flux density of the first magnet in the inner area, a close contact force may be provided to the edge portion of the display panel.

A magnetic pad may be used instead of the first magnet. In this case, the magnetic sheet is provided on the wall body.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein including technical or scientific terms have the same meanings as those generally understood by those of ordinary skill in the art to which the present inventive concept may pertain.

An expression used in a singular form in the present specification also includes the expression in its plural form unless clearly specified otherwise in context.

Terms such as "first" and "second" are used herein merely to describe a variety of constituent elements, but the constituent elements are not limited by the terms. Such terms are used only for the purpose of distinguishing one constituent element from another constituent element.

Furthermore, when an element is described to exist "on" or "on a rear surface of" another element, the element may exist directly on or on a rear surface of the other element or the element is not in contact with the other element or a third element may be interposed therebetween.

Hereinafter, a display panel support unit and a display device using the same according to embodiments of the present disclosure will be described in detail with reference to the attached drawings.

A display device according to an embodiment of the present disclosure is attached to a wall body by magnetic coupling.

In order to directly attach a display device to a wall body by magnetic coupling without using a bracket or processing the wall body, a magnetic body such as a steel sheet is attached to the wall body and a magnet is arranged on a rear surface of the display device.

Although it is possible to make the rear surface of the display device a magnetic body and attach a magnet on the wall body, it may be difficult for a user to easily detach and attach the display device due to an increase in the weight of the display device.

Furthermore, a magnet may be arranged along an edge of the rear surface of the display device. However, in this case, due to a limited magnet area, a magnetic coupling force may not overcome the weight of the display device so that the display device may fall.

Furthermore, a magnet may be arranged in an inner area on the rear surface of the display device. In this case, although the danger that the display device falls may be addressed due to a large magnet area, the magnet coupling may not be made in an area at an edge of the rear surface of the display device, and thus, a lift phenomenon may occur in an edge area of the display device.

As a result, when a magnet is arranged on a rear surface of a display device, it is beneficial for the magnet to be arranged in both inner and edge areas of a rear surface of the display device.

Figure 1:
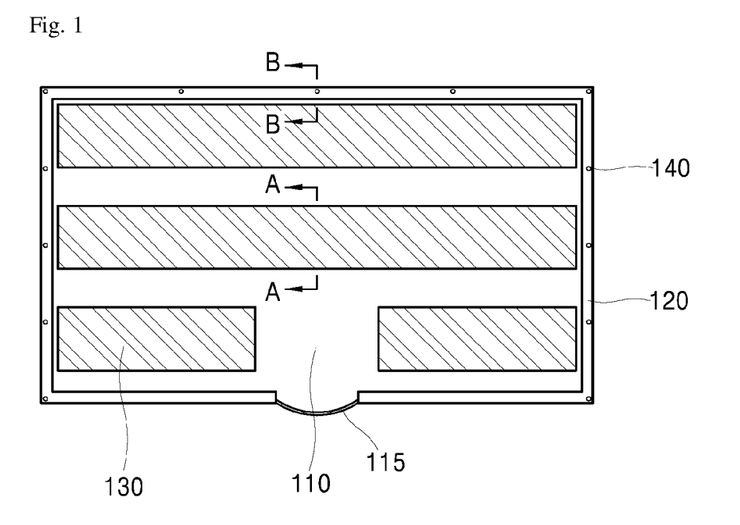
FIG. 1 is a rear view of a display panel supporting unit according to an embodiment of the present disclosure.

FIG. 1 is a rear view of a display panel supporting unit according to an embodiment of the present disclosure.

The display panel supporting unit according to an embodiment of the present disclosure supports at least a rear surface of a display panel. The display panel supporting unit may include a back cover supporting the rear surface of the display panel and a middle cabinet supporting a side surface of the display panel and a side surface and a rear surface of the back cover. The back cover and the middle cabinet are to support at least the rear surface of the display panel, and are referred to as the support members in the following description.

The display panel supporting unit according to an embodiment of the present disclosure may include support members 110 and 120, a first magnet 130, and a second magnet 140.

Each of the support members 110 and 120 may include rear surface. The support member may be the first support member 110 and the second support member 120, as illustrated in FIG. 1. The first support member 110 supports the rear surface of the display panel, and may be the back cover. The second support member 120 supports the side surface of the display panel and the side surface and the rear surface of the back cover, and may be the middle cabinet.

Furthermore, the support members 110 and 120 may be formed of a light metal material such as aluminum, titanium, or magnesium, or a polymer-based material such as reinforced plastic.

The first magnet 130 is provided in a first area of the rear surface of the support member. The second magnet 140 is provided in a second area outside the first area on a rear surface of the support member. In detail, the first magnet 130 is arranged on the rear surface of the first support member 110, and the second magnet 140 is arranged on the rear surface of the second support member 120.

A residual magnetic flux density of the second magnet 140 is equal to or greater than that of the first magnet 130. When the residual magnetic flux density of the second magnet 140 is lower than that of the first magnet 130, a lift phenomenon may occur in an area at the edge of the display panel.

The residual magnetic flux density of the second magnet 140 is higher than the residual magnetic flux density of the first magnet 130. As illustrated in FIG. 1, when the rear surface of the second support member 120 where the second magnet 140 is arranged protrudes higher than the rear surface of the first support member 110, if the second magnet 140 is attached to the rear surface of the second support member 120 in the form of a plate magnet, the thickness of the display device may increase as much as the thickness of the second magnet 140 protruding from the rear surface of the second support member 120.

Accordingly, a concave portion is provided in the second support member 120 so that the second magnet 140 may be inserted in the concave portion. As the second magnet 140 is inserted in the concave portion, the second magnet 140 has the same plane as the surface of the second support member 120 or does not protrude much.

The second magnet 140 may be in a single magnet shape having a diameter of about 10 mm and a thickness of about 0.5 mm. When the residual magnetic flux density of the second magnet 140 is greater than the residual magnetic flux density of the first magnet 130, the area of the second magnet 140 is not relatively great to the area of the second support member 120, and the area of the edge of the rear surface of the display device may well adhere to a magnetic sheet such as a steel sheet fixed to the wall body due to the second magnet 140.

The first magnet 130 may be a rubber magnet that is easily manufactured in the form of a thin plate magnet. The second magnet 140 may be a rubber magnet, particularly a rare-earth magnet. In another example, a magnetic pad may be used instead of the first magnet 130. In this case, a magnetic sheet is provided on the wall body. In the case of a rare-earth magnet, the rare-earth magnet may have a magnet coupling with the magnetic sheet. When the magnetic pad is used instead of the first magnet 130, the second magnet 140 may be the rare-earth magnet.

Figure 2:
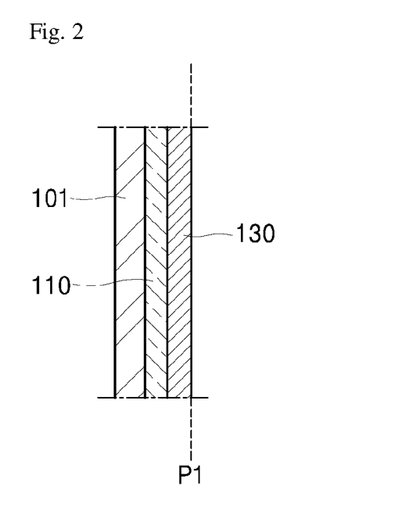
FIG. 2 is a cross-sectional view taken along line A-A of FIG. 1.

FIG. 2 is a cross-sectional view taken along a line A-A of FIG. 1.

Referring to FIG. 2, the first magnet 130 is arranged on the rear surface of the first support member 110 that supports a display panel 101 from a rear surface thereof.

The display panel 101 and the first support member 110 may be arranged simply in a close contact state, bonded to each other by using a double-sided adhesive tape, or coupled to each other by using a screw. The first support member 110 and the first magnet 130 may be bonded to each other by using a double-sided adhesive tape or coupled to each other by using a screw.

Furthermore, the shape of a front surface of the first magnet 130 may be determined by the shape of the rear surface of the first support member 110. For example, as illustrated in FIG. 2, when the rear surface of the first support member 110 has a planar shape, the front surface of the first magnet 130 may have a planar shape corresponding to the shape of the rear surface of the first support member 110.

The first magnet 130 may be arranged across the entire area of the rear surface of the first support member 110 in a shape of a single plate magnet or a plurality of plate magnets.

Furthermore, as illustrated in FIG. 1, the first magnet 130 may be arranged on the rear surface of the first support member 110 only in an area other than a connector portion 115 and a peripheral portion thereof. The connector portion 115 is a portion electrically connected to a power supply unit for supplying power to the display panel 101. A circuit portion is arranged around the connector portion 115 and thus the connector portion 115 is relatively thicker than the other portions. Accordingly, when the first magnet 130 is arranged on the connector portion 115 and the peripheral portion thereof in the rear surface of the first support member 110, the thickness of the display device may increase as much as the thickness of the first magnet 130. Accordingly, the first magnet 130 may be arranged only in the area other than the above portions.

Figure 3:
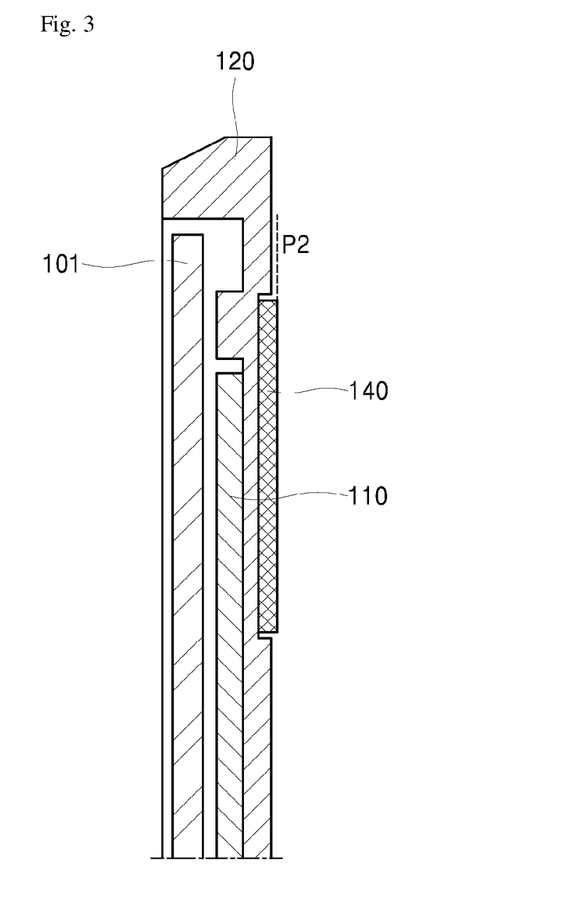
FIG. 3 is a cross-sectional view taken along line B-B of FIG. 1.

FIG. 3 is a cross-sectional view taken along line B-B of FIG. 1.

Referring to FIG. 3, the second magnet 140 is arranged on the rear surface of the second support member 120 supporting at least the rear surface of the first support member 110.

The second magnet 140 may be a rare-earth magnet exhibiting very high magnet strength such as a neodymium (Nd) magnet or a samarium (Sm) magnet. The rare-earth magnet has a residual magnetic flux density of about 11.8 KGs or more, which is about ten times higher than the residual magnetic flux density of a rubber magnet. As such, when the second magnet 140 is the rare-earth magnet, even in a single magnet shape, the edge area of the rear surface of the display device may well closely contact the steel sheet fixed to the wall body.

The second support member 120 may support the side surface of the display panel 101. The first support member 110 and the second support member 120 may be bonded to each other by using a double-sided adhesive tape or coupled to each other by using a screw. The second support member 120 and the second magnet 140 may be bonded to each other by using a double-sided adhesive tape or coupled to each other in a forcible insertion manner.

The second magnet 140 may have a plate magnet shape to be attached to the rear surface of the second support member 120. In this case, the thickness of the display device increase as much as the thickness of the second magnet 140. Accordingly, the second magnet 140 may be arranged in the concave portion provided in the second support member 120 in a single magnet shape.

Figure 4:
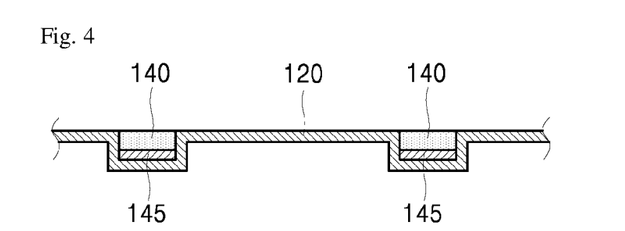
FIG. 4 illustrates an example in which a second magnet is arranged on a second support member.

FIG. 4 illustrates an example in which the second magnet 140 is arranged on the second support member 120.

Referring to FIG. 4, the concave portion is provided in the second support member 120, and the second magnet 140 in a single magnet shape is arranged in the concave portion. Furthermore, in an example illustrated in FIG. 4, the second magnet 140 is attached to the second support member 120 by a double-sided adhesive tape 145.

Figure 5:
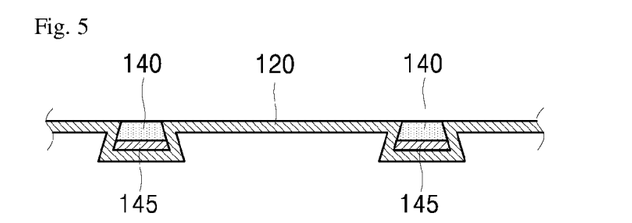
FIG. 5 illustrates another example in which the second magnet is arranged on the second support member.

FIG. 5 illustrates another example in which the second magnet 140 is arranged on the second support member 120.

In the case of FIG. 5, the concave portion provided in the second support member 120 has a width that decreases toward the rear surface of the second support member 120. With respect to the display panel 101, the concave portion provided in the second support member 120 has a width that increases toward the display panel 101. In this case, the second magnet 140 fixed by the double-sided adhesive tape 145 may be more firmly fixed to the second support member 120 due to the shape of the concave portion having the width decreasing toward the rear surface of the second support member 120.

Figure 9:
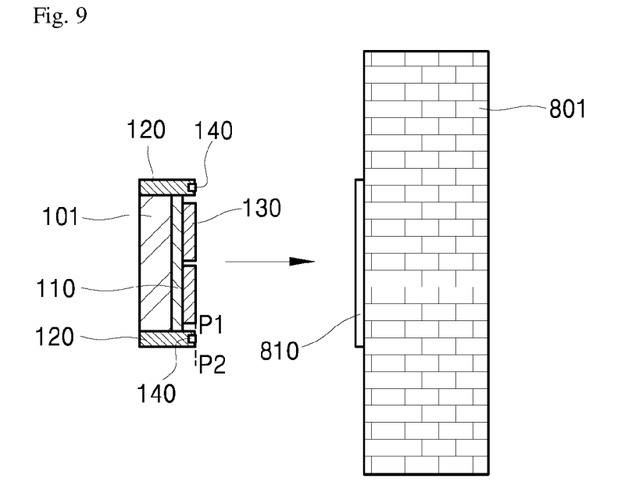
FIG. 9 illustrates an example in which a display device according to an embodiment of the present disclosure is fixed to a wall body.

A plane P1 of FIG. 2 including the surface of the first magnet 130 and a plane P2 of FIG. 3 including the surface of the second magnet 140 may be the same plane or have a height difference of equal or less than 1 mm. The plane P1 including the surface of the first magnet 130 and the plane P2 including the surface of the second magnet 140 are illustrated in FIG. 9. When the height difference between the plane P1 including the surface of the first magnet 130 and the plane P2 including the surface of the second magnet 140 exceeds 1 mm, parts of the inner area and the edge area of the rear surface of the display device may not closely contact each other or undesired warpage may occur.

Figure 6:
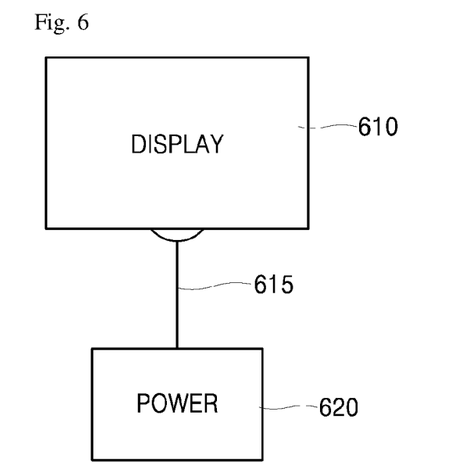
FIG. 6 schematically illustrates a display device according to an embodiment of the present disclosure.
Figure 7:
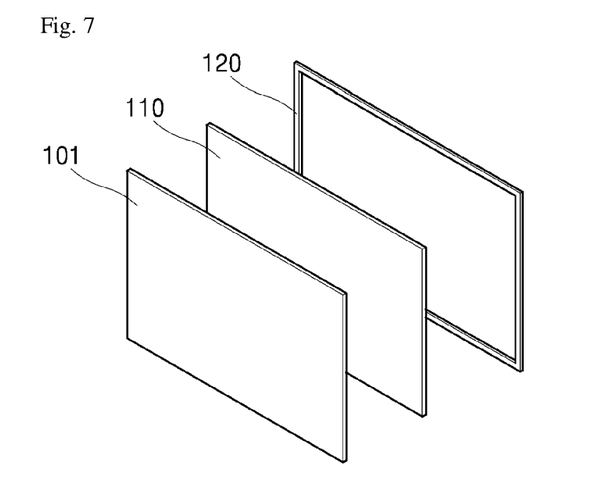
FIG. 7 schematically illustrates a display panel, a first support member, and a second support member.

FIG. 6 schematically illustrates a display device according to an embodiment of the present disclosure. FIG. 7 schematically illustrates the display panel 101, the first support member 110, and the second support member 120.

The display device according to an embodiment of the present disclosure is to facilitate attachment and detachment with respect to the wall body. To this end, the display device may be carried with user's hands and may not fall by the magnet coupling. Accordingly, the display panel 101 of the display device may be as light as possible.

A display device applicable to an embodiment of the present disclosure may include liquid crystal display (LCD) devices or organic light-emitting diode display (OLED) devices. Among these display devices, the OLED display device may be more appropriate as the display device according to the present disclosure because a backlight device is not needed so that the OLED display device may be manufactured to be light and the OLED display device has a fast response speed and a wide viewing angle.

Referring to FIG. 6, the display device according to an embodiment of the present disclosure may include a display panel 610 and a power supply unit 620. Referring to FIG. 7, a display panel supporting unit for supporting the display panel 610 is arranged on the rear surface of the display panel 610, or on the rear and side surfaces of the display panel 610. The display panel supporting unit may include the first support member 110 such as a back cover and the second support member 120 such as a middle cabinet. As described above, a first magnet is arranged on the rear surface of the first support member 110 of the display panel supporting unit and a second magnet is arranged on the rear surface of the second support member 120.

Furthermore, referring to FIG. 6, the power supply unit 620 is separated from the display panel 610. In general, the power supply unit 620 is located at the rear or side surface of the display panel 610. In the present disclosure, however, the power supply unit 620 is provided separated from the display panel 610 so that the display panel 610 may be manufactured to be light accordingly. However, to operate the display panel 610, the power supply unit 620 is electrically connected to the display panel 610 via a power supply line 615. The power supply line 615 may be a round cable or a flexible flat cable (FFC).

Figure 8:
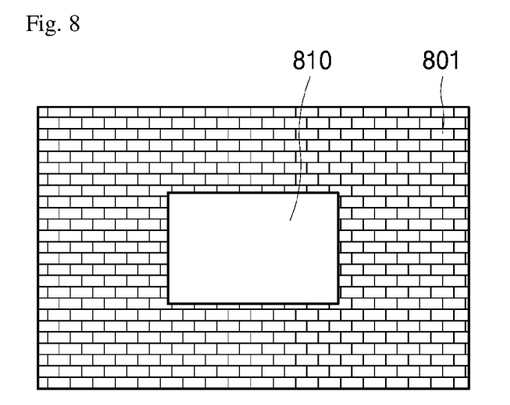
FIG. 8 illustrates an example in which a magnetic sheet is fixed to a wall body.

FIG. 8 illustrates an example in which a magnetic sheet 810 is fixed to a wall body 801. FIG. 9 illustrates an example in which a display device according to an embodiment of the present disclosure is fixed to the wall body 801.

The magnetic sheet 810 having properties of being attracted to a magnet may be an iron (Fe) including sheet, for example, a carbon steel sheet, a stainless steel sheet, a silicon steel sheet, or a permalloy sheet.

The magnetic sheet 810 may be easily fixed to the wall body 810 by using a double-sided adhesive tape, without special processing. When a print layer is arranged on a surface of the magnetic sheet 810, the magnetic sheet 810 may be aesthetic.

In the display device according to an embodiment of the present disclosure, the display device except for the power supply unit, that is, an assembly of the display panel and the display panel supporting unit, may be attached to the magnetic sheet 810 fixed to the wall body 801 as illustrated in FIG. 9.

Referring to FIG. 9, in the display device according to an embodiment of the present disclosure, the support member is included in the display panel supporting unit. A plate magnet is arranged as a first magnet in an inner area of the rear surface of the support member, and a single magnet having a residual magnetic flux density that is equal to or greater than the residual magnetic flux density of the plate magnet is arranged in an edge area surrounding the inner area of the rear surface of the support member.

The residual magnetic flux density of the second magnet is equal to or greater than the residual magnetic flux density of the first magnet. For example, both the first magnet and the second magnet may be rubber magnets. In another example, while the first magnet is a rubber magnet, the second magnet may be a rare-earth magnet having a high residual magnetic flux density.

In detail, the first support member 110 supports the rear surface of the display panel 101, and the first magnet 130 in a plate magnet shape is provided on the rear surface of the display panel 101. The second support member 120 supports the edge of the first support member 110, and the second magnet 140 in a single magnet shape is provided on the rear surface of the second support member 120.

Accordingly, as the first magnet 130 and the second magnet 140 are magnet coupled to the magnetic sheet 810, the other portion of the display device except for the power supply unit may closely contact the wall body.

In another example, a magnetic pad may be used instead of the first magnet 130. In this case, the magnetic sheet is provided on the wall body 801. The second magnet 140 may be a rare-earth magnet.

EXAMPLES

Hereinafter, the structure and operation of the present disclosure will now be described more fully through examples of embodiments of the present disclosure. However, the present disclosure may be embodied in many different forms and should not be construed as being limited to the examples set forth herein; rather, these examples are provided so that this disclosure will be thorough and complete, and will fully convey the concept of the disclosure to those of ordinary skill in the art. Since any content not described herein can be sufficiently technically derived by those skilled in the art, description thereof will be omitted.

Display Panel Supporting Unit Samples

In samples 1-4, a back cover is used as a first support member and a middle cabinet is used as a second support member. In samples 1 and 2, a rubber magnet is used as the first magnet. Furthermore, in samples 1 and 3, a neodymium magnet is used as the second magnet, and in sample 4, a rubber magnet is used as the second magnet.

In the case of sample 1, a rubber magnet having a plate magnet shape is attached to a rear surface of the back cover, and a neodymium magnet having a single magnet shape is attached to a middle cabinet having a concave portion provided on a rear surface thereof.

In the case of sample 2, a rubber magnet is attached to the rear surface of the back cover in the same arrangement shape as sample 1, and no magnet is attached to the middle cabinet.

In the case of sample 3, a neodymium magnet is attached to the middle cabinet having the concave portion provided on the rear surface thereof in the same arrangement shape as sample 1, and no magnet is attached to the rear surface of the back cover.

In the case of sample 4, a rubber magnet is attached to the rear surface of the back cover in the same arrangement shape as sample 1, and a rubber magnet having a cut plate magnet shape is attached to the middle cabinet that is not concave portion processed.

Evaluation of Physical Properties

Display panel supporting unit samples 1-4 are attached to a steel sheet fixed to a wall body and then a degree of close contact and a degree of lift of an edge portion are evaluated. The degree of close contact is checked with the naked eyes, and the degree of lift of the edge portion is measured by using a gap gauge.

Table 1 shows a degree of close contact and a degree of lift of an edge portion of the display panel supporting unit according to the type of magnets and an arrangement structure of magnets.

In Table 1, B/C denotes the back cover, and M/C denotes the middle cabinet.

TABLE 1

|  | Sample 1 | Sample 2 | Sample 3 | Sample 4 |
| --- | --- | --- | --- | --- |
| Concept | B/C: rubber magnet<br>M/C: Nd magnet | B/C: rubber magnet<br>M/C: X | B/C: X<br>M/C: Nd magnet | B/C: rubber magnet<br>M/C: rubber magnet |
| Degree of close contact | Full close contact | Edge portion lifted | Fall | Full close contact |
| Degree of lift of edge portion | Equal to or less than 0.15 mm | Partially equal to or greater than 0.5 mm | — | Equal to or less than 0.15 mm |

Referring to Table 1, in the case of samples 1 and 4 in which magnets are arranged on both the rear surface of the back cover and the rear surface of the middle cabinet, the degree of close contact is superior and the degree of lift of the edge portion is very low.

In contrast, in the case of sample 2 in which the magnet is arranged only on the rear surface of the back cover and no magnet is arranged on the rear surface of the middle cabinet, the edge portion is partially lifted by 0.5 mm or more. Furthermore, in the case of sample 3 in which the magnet is arranged only on the rear surface of the middle cabinet and no magnet is arranged on the back cover, the display device falls because the magnetic coupling fails to overcome the weight of the display device.

Furthermore, in the case of sample 4, although the edge portion has a full close contact with the steel sheet, the thickness of the display panel supporting unit is relatively thicker than that of sample 1 as much as the thickness of the rubber magnet. Thus, it seems that a shape like sample 1 is most preferable to achieve both lightness and slimness.

As described above, the display panel supporting unit according to an embodiment of the present disclosure may be easily attached to the steel sheet fixed to the wall body via the first magnet arranged in the inner area of the rear surface of the display panel and the second magnet arranged in the outer area thereof, and may be easily detached from the steel sheet so as to be easily attached to another steel sheet at a different position. In particular, although the area of the magnet is not large, since the magnet strength of the second magnet in the outer area of the rear surface of the display panel is high, superior close contact force may be provided to the edge portion of the display panel.

Furthermore, since a separate complicated member such as a bracket for supporting the display panel may not be needed and the magnetic sheet may be easily attached and fixed to the wall body by using a double-sided adhesive tape, without performing wall-body processing, an overall fixing structure of the display panel may be simplified.

In particular, since the magnet strength of the second magnet arranged in the outer area of the rear surface of the display panel is higher, the close contact force at the edge portion of the display panel is superior. Accordingly, the lift of the edge portion that may occur when the magnet is arranged only in the inner area of the rear surface of the display panel may be reduced or prevented.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

What is claimed is:

1. A display panel supporting unit which supports a rear surface of the display panel, the display panel supporting unit comprising: a first support member arranged on the rear surface of the display panel; a second support member covering a side surface of the first support member and arranged on a portion of the rear surface of the first support member which overlaps an edge portion of the display panel; a first magnet arranged on said portion of the rear surface of the first support member which is surrounded by the edge portion of the display panel; and a second magnet arranged on the second support member and surrounding the first magnet, wherein the first magnet is exposed at the rear surface of the first support member and the second magnet is exposed at a rear surface of the second support member, wherein a residual magnetic flux density of the second magnet is equal to or greater than a residual magnetic flux density of the first magnet for preventing lift of the edge portion of the display panel when the display panel is attached to a magnetic sheet fixed to a wall body.

2. The display panel of claim 1, wherein the second magnet is a rare-earth magnet.

3. The display panel of claim 1, wherein
a concave portion is provided in the second support member and the second magnet is arranged in the concave portion.

4. The display panel of claim 3, wherein the concave portion has a shape such that a width of the concave portion decreases toward the rear surface of the second support member.

5. The display panel of claim 1, wherein surfaces of the first magnet and the second magnet are the same plane or a height difference between the surfaces of the first and second magnets is equal to or less than 1 mm.

6. A display panel supporting unit which supports a rear surface of a display panel, the display panel supporting unit comprising: a first support member arranged on the rear surface of the display panel; a second support member covering a side surface of the first support member and arranged on a portion of the rear surface of the first support member which overlaps an edge portion of the display panel; a magnetic pad arranged on said portion of the rear surface of the first support member which is surrounded by the edge portion of the display panel; and a rare-earth magnet on the second support member surrounding the first magnet, wherein the magnetic pad is exposed at the rear surface of the first support member and the rare-earth magnet is exposed at a rear surface of the second support member, wherein a residual magnetic flux density of the rare-earth magnet is equal to or greater than a residual magnetic flux density of the magnetic pad for preventing lift of the edge portion of the display panel when the display panel is attached to a magnetic sheet fixed to a wall body.

7. A display device having the display panel according to claim 1, further comprising a power supply unit separated from the display panel and electrically connected to the display panel.

8. A display device comprising:
a display panel;
a power supply unit separated from the display panel and electrically connected to the display panel; and
the display panel supporting unit defined in claim 6, which supports the rear surface of the display panel.

* * * * *